United States Patent
Dejima (10) Patent No.: US 10,359,584 B2
(45) Date of Patent: Jul. 23, 2019

(54) LIGHT SOURCE DEVICE

(71) Applicant: NICHIA CORPORATION, Anan-shi, Tokushima (JP)

(72) Inventor: Norihiro Dejima, Yokohama (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/721,455

(22) Filed: Sep. 29, 2017

(65) Prior Publication Data
US 2018/0095285 A1    Apr. 5, 2018

(30) Foreign Application Priority Data

Sep. 30, 2016 (JP) ................... 2016-194136
Jul. 13, 2017 (JP) ................... 2017-137104

(51) Int. Cl.
*G02B 6/42* (2006.01)
*H01S 5/40* (2006.01)
(Continued)

(52) U.S. Cl.
CPC ....... *G02B 6/4214* (2013.01); *G02B 6/02042* (2013.01); *G02B 6/036* (2013.01);
(Continued)

(58) Field of Classification Search
CPC .... G02B 6/4214; G02B 6/036; G02B 6/4206; G02B 27/1006; G02B 6/02042; G02B 27/30; H01S 5/4012; H01S 5/02469
See application file for complete search history.

(56) References Cited

U.S. PATENT DOCUMENTS 6,192,062 B1    2/2001  Sanchez-Rubio et al.
9,014,220 B2*   4/2015  Minelly ............ H01S 3/06704
                                                           372/6
(Continued)

FOREIGN PATENT DOCUMENTS

| CN | 105892067 A | 8/2016 |
|----|---|---|
| EP | 1 756 922 A | 7/2008 |
| JP | 2000-019362 A | 1/2000 |
| JP | 2010-171375 A | 8/2010 |
| JP | 2013-026162 A | 2/2013 |
| JP | 2013-521666 A | 6/2013 |
| JP | 2015-072955 A | 4/2015 |
| WO | WO-2004/087726 A1 | 10/2004 |
| WO | WO-2016/060933 A1 | 4/2016 |
| WO | WO-2014/087726 A1 | 1/2017 |

OTHER PUBLICATIONS

Search Report dated Mar. 16, 2018 in corresponding U.K. application No. 1715721.5.

*Primary Examiner* — Ryan A Lepisto
(74) *Attorney, Agent, or Firm* — Foley & Lardner LLP (57) ABSTRACT

A light source device includes: a laser diode bar comprising a plurality of strips configured to emit light in a wavelength region with a predetermined width; a light guiding part comprising a plurality of cores, each of which corresponds to a respective one of the plurality of strips, and on each of which light emitted from the respective one of the strips is incident; a diffraction grating on which light emitted from the cores is incident; and a resonator mirror on which light emitted from the diffraction grating is incident. The cores are disposed such that light emitted from the cores is incident on a region of the diffraction grating at different angles. The diffraction grating comprises a pattern configured to diffract light incident on the diffraction grating from the cores such that the diffracted light is emitted along a single optical axis.

12 Claims, 6 Drawing Sheets

(51) Int. Cl.
| | |
|---|---|
| *H01S 5/14* | (2006.01) |
| *H01S 5/343* | (2006.01) |
| *G02B 27/10* | (2006.01) |
| *G02B 6/036* | (2006.01) |
| *G02B 6/02* | (2006.01) |
| *G02B 27/30* | (2006.01) |
| *H01S 5/024* | (2006.01) |
| *H01S 3/081* | (2006.01) |

(52) U.S. Cl.
CPC ....... *G02B 6/4206* (2013.01); *G02B 27/1006* (2013.01); *G02B 27/30* (2013.01); *H01S 5/141* (2013.01); *H01S 5/34333* (2013.01); *H01S 5/4012* (2013.01); *H01S 5/4087* (2013.01); *H01S 3/0813* (2013.01); *H01S 5/02469* (2013.01)

(56) References Cited

U.S. PATENT DOCUMENTS

| | | |
|---|---|---|
| 9,711,950 B2 * | 7/2017 | Zimer .................. H01S 5/4012 |
| 2007/0291812 A1 | 12/2007 | Petersen et al. |
| 2010/0193710 A1 | 8/2010 | Wakabayashi et al. |
| 2011/0216792 A1 | 9/2011 | Chann et al. |
| 2013/0027964 A1 | 1/2013 | Toyota et al. |
| 2015/0303656 A1 | 10/2015 | Morita et al. |
| 2017/0279246 A1 | 9/2017 | Muendel et al. |

\* cited by examiner

LIGHT SOURCE DEVICE

CROSS-REFERENCE TO RELATED APPLICATIONS

This application claims priority to Japanese Patent Application No. 2016-194136, filed on Sep. 30, 2016, and Japanese Patent Application No. 2017-137104, filed on Jul. 13, 2017, the contents of which are hereby incorporated by reference in their entireties.

BACKGROUND

1. Technical Field

The present disclosure relates to a light source device configured to emit high-output laser light by wavelength beam combining (WBC).

2. Description of Related Art

For applications such as laser processing, demand for light source devices configured to emit laser light with higher output has increased. In view of this, light source devices using wavelength beam combining has been proposed in which light emitted from a linear array of gain elements having a predetermined gain (i.e., wavelength width) is focused on a diffraction grating through a condensing lens, and diffracted light is emitted from the diffraction grating along a single optical axis to obtain laser light with high output (see, for example, U.S. Pat. No. 6,192,062 B1).

However, in the case in which a length of the linear array is increased for enhancement of the output, a diameter of the condensing lens corresponding to the linear array is increased. In this case, in order to reduce aberration, it is necessary to use a very expensive lens for the condensing lens. To address this, a light source device has been proposed in which a linear array of laser elements is divided into a plurality of single laser elements so that an inexpensive small condensing lens can be applied with respect to each of the plurality of single elements (see, for example, JP 2013-521666 A).

SUMMARY

In the light source device described in JP 2013-521666 A, condensing lenses are used, which requires each pair of the laser element and the condensing lens to be disposed away from respective diffraction grating by a focal length, and requires a plurality of pairs of the laser element and the condensing lens to be arranged at angles different from each other. Accordingly, assembly of the light source device may be complicated, and reducing the size of the light source device may be difficult.

Certain embodiments described in this application have been developed in view of the above-mentioned disadvantages, and an object of certain embodiments is to provide a small light source device that can emit high-output laser light.

According to one embodiment, a light source device includes: a laser diode bar having a plurality of strips configured to emit light in a wavelength region with a predetermined width; a light guiding part having a plurality of cores each of which corresponds to a respective one of the plurality of strips, and on each of which light emitted from the respective one of the strips is incident; a diffraction grating on which light emitted from the cores is incident; and a resonator mirror on which light emitted from the diffraction grating is incident. The cores are disposed so that light emitted from the cores is incident on one region of the diffraction grating at different angles. The diffraction grating has such a pattern that allows diffracted light of light incident on the diffracted grating from the cores is emitted along a single optical axis.

The resonator mirror is disposed in so that an optical axis of light emitted from the resonator mirror is coincident with the single optical axis of the diffracted light.

With the configuration as described above, a small light source device that can emit high-output laser light with high output can be provided.

DETAILED DESCRIPTION OF EMBODIMENTS

In the description below, certain embodiments of the present disclosure will be described with reference to the drawings.

Light Source Device According to First Embodiment of the Present Disclosure

Figure 1:
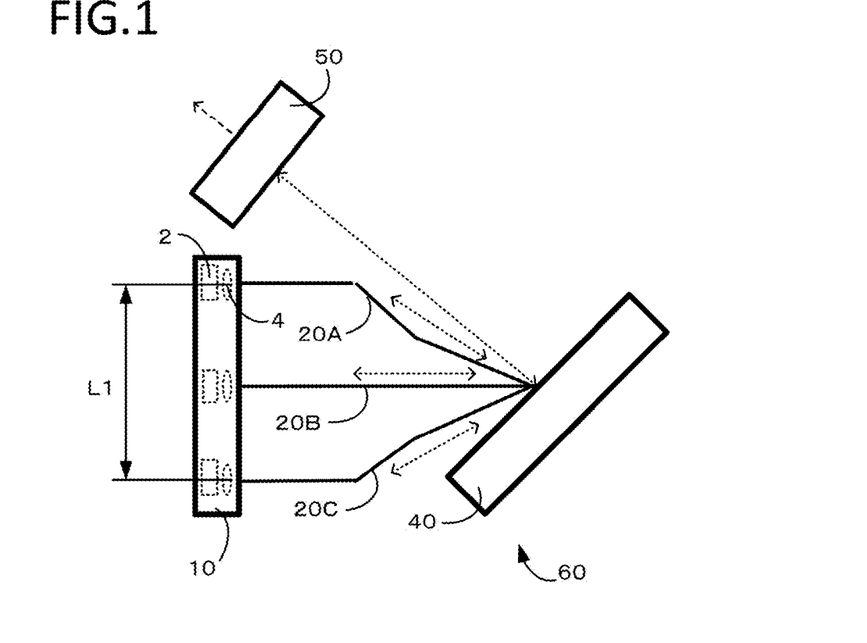
FIG. 1 is a plan view schematically showing a reflection type light source device including optical fibers according to a first embodiment of the present disclosure.

First, a light source device 60 according to a first embodiment of the present disclosure will be described with reference to FIG. 1. FIG. 1 is a plan view schematically showing a reflection-type light source device 60 including optical fibers.

The light source device 60 includes a laser diode bar 10 having a plurality of light-emitting strips 2 (in the present embodiment, three strips 2) configured to emit light in a wavelength region with a predetermined width; a light guiding part having a plurality of cores each of which corresponds to respective one of the plurality of strips 2 and on each of which light emitted from respective one of the strips 2 is to be incident; a diffraction grating 40 on which light emitted from the cores is to be incident; and a resonator mirror 50 on which light emitted from the diffraction grating 40 is to be incident. In the light source device 60 according to the present embodiment, a plurality of optical fibers 20A to 20C (in the present embodiment, three optical fibers) each having a core and a cladding surrounding the core are used for the light guiding part having a plurality of cores.

In the present specification, the optical fiber is a fiber-shaped component in which glass, transparent plastic or the like processed into a narrow and long shape is covered with a covering. In the optical fiber, a fiber core, which is referred to as the core and serves as a light-traveling path, is surrounded by a cladding having a refractive index lower than that of the core, and the cladding is covered with an opaque covering. Light incident on the core at one end of the optical fiber is totally reflected repeatedly at a boundary between the core and the cladding, and travels from one end to the other end of the optical fiber with a very small loss. The optical fiber can be bent into any appropriate shape, and therefore can be disposed in any appropriate shape.

In the laser diode bar 10, three identical strips 2 configured to emit light in a predetermined wavelength range are arranged in one row. Collimating lenses 4 are respectively disposed at an emission side of respective one of the strips 2. The optical fibers 20 are disposed so as to be connected to the laser diode bar 10 and the diffraction grating 40 without being separated from them. With the collimating lens 4, collimated light is emitted from the laser diode bar 10, and is incident on the cores of the optical fibers 20A to 20C corresponding to respective one of the strips 2. Light incident on the cores of the optical fibers 20A to 20C is transmitted through the cores to a diffraction grating 40 side.

The optical fibers 20A to 20C are disposed such that collimated light from the collimating lens 4 is incident on the core at an end of each of the optical fibers 20A to 20C at a laser diode bar 10 side. Further, the optical fibers 20A to 20C are disposed such that, at an end of each of the optical fibers 20A to 20C at a diffraction grating 40 side, light emitted from each of the cores is incident on one region of the diffraction grating 40 at different incident angles. In other words, optical fibers 20A to 20C are disposed such that each of the cores are not parallel to one another at an end of respective one of the optical fibers 20A to 20C on the diffraction grating 40 side, i.e. an end of respective one of the optical fibers 20A to 20C on the emission side. With this arrangement, diffracted light of a predetermined wavelength component in light incident on the diffraction grating 40 from the cores is emitted along a single optical axis.

Figure 6:
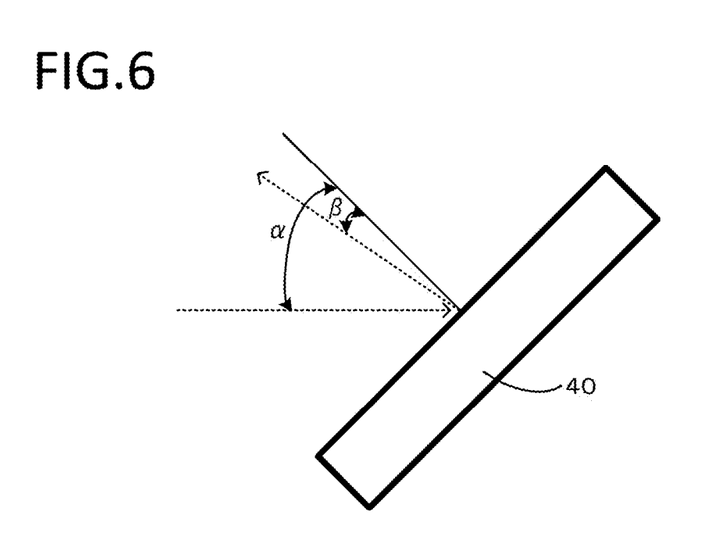
FIG. 6 is a schematic diagram showing an incident angle of light incident on a diffraction grating and a diffraction angle of diffracted light.

This will be described with reference to FIG. 6. FIG. 6 is a schematic diagram showing an incident angle of light incident on the diffraction grating 40, and a diffraction angle of diffracted light. Where α is an incident angle of incident light, which is an angle with respect to a normal line of an incident surface of the diffraction grating 40, and β is a diffraction angle of diffracted light, which is an angle with respect to the normal line of the incidence surface of the diffraction grating 40 in FIG. 6, α and β satisfy the relationship of formula 1 as below. The relationship is based on the case in which reflected first-order diffracted light is used.

$$\sin\alpha + \sin\beta = N \cdot m \cdot \lambda \quad \text{Formula 1}$$

Description of Symbols
α: incident angle
β: diffraction angle
N: number of grooves per 1 mm of diffraction grating
m: diffraction order (m=1 in this embodiment)
λ: wavelength In the case where each of the strips 2 emits light having a center wavelength of 405 nm and a gain (i.e., wavelength width) Δλ, of 10 nm, that is, light emitted from strips 2 has a wavelength in a range of 400 nm to 410 nm, and the number of grooves in the diffraction grating is 2400, incident angles α giving the same diffraction angle β with the wavelength of, for example, 400, 401, 402 . . . , 410 nm, which are integer values, are as shown in Table 1 below.

TABLE 1

| λ (nm) | α (degree) | β (degree) |
|---|---|---|
| 400 | 44.03 | 15.36 |
| 401 | 44.23 | 15.36 |
| 402 | 44.42 | 15.36 |
| 403 | 44.61 | 15.36 |
| 404 | 44.80 | 15.36 |
| 405 | 45.00 | 15.36 |
| 406 | 45.20 | 15.36 |
| 407 | 45.39 | 15.36 |
| 408 | 45.59 | 15.36 |
| 409 | 45.78 | 15.36 |
| 410 | 45.98 | 15.36 |

Figure 7A:
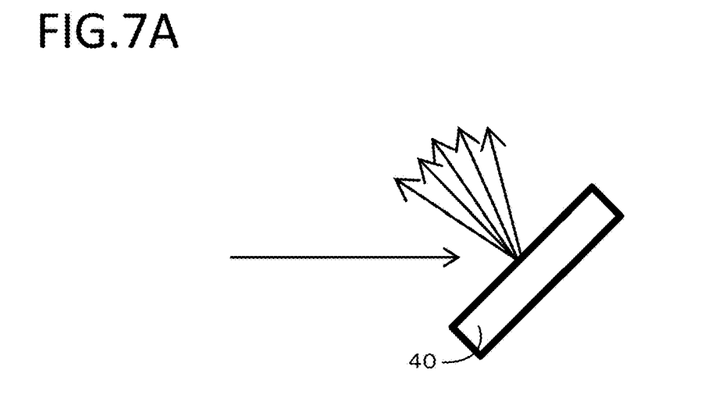
FIGS. 7A to 7C are diagrams schematically showing a disposition of a diffraction grating and a resonator mirror, and reflection of light.
Figure 7B:
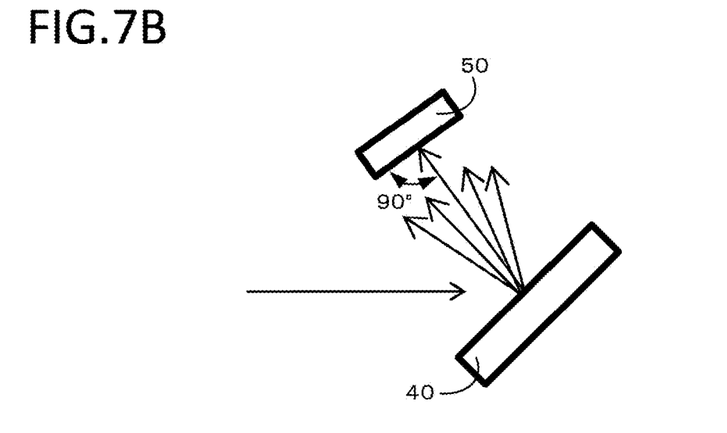
Figure 7C:
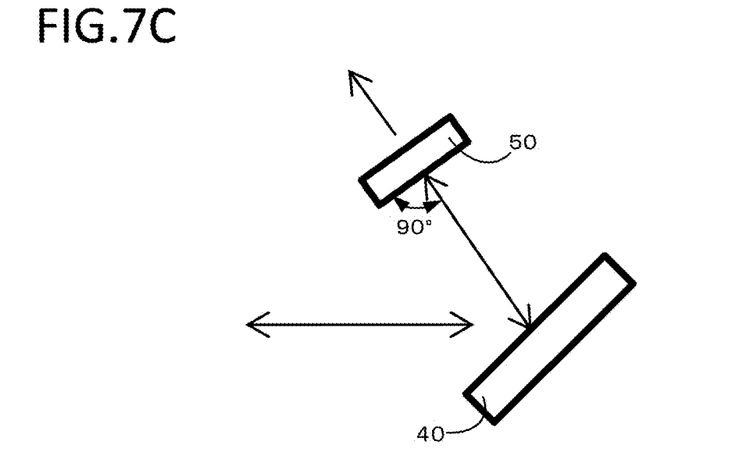

In the case where each of the strips 2 emits light having a center wavelength of 405 nm and a gain (wavelength width) Δλ, of 10 nm and, for example, the incident angle α of light from the core of the upper optical fiber 20A is 44.03 degrees, the incident angle α of light from the core of the middle optical fiber 20B is 45.00 degrees, and the incident angle α of light from the core of the lower optical fiber 20C is 45.98 degrees, in FIG. 1, the diffraction angle of diffracted light of wavelength components of 400 nm, 405 nm and 410 nm in light emitted from strips 2 is 15.36 degrees. By disposing the resonator mirror 50 to be perpendicular to the direction of the diffraction angle, the strips 2 are externally resonated at the respective wavelengths, and as a result, light can be emitted along a single optical axis from the diffraction grating 40. More specifically, light is dispersedly reflected in accordance with the wavelength of light incident on the diffraction grating 40 as shown in FIG. 7A, but when the resonator mirror 50 is disposed to be perpendicular to reflected light having a predetermined wavelength as shown in FIG. 7B, only light having a specific wavelength can be externally resonated and outputted as shown in FIG. 7C. With the diffraction grating having a pattern with an appropriate number of grooves per 1 mm in accordance with the wavelength region and incident angle of light incident on the diffraction grating, diffracted light incident from the cores can be emitted along one optical axis.

Next, the resonator mirror 50 will be described. The optical axis in the resonator mirror 50 is coincident with one optical axis of diffracted light from the diffraction grating 40. The resonator mirror 50 is a mirror having a reflectance of less than 100% (i.e. transmissive of a part of light). The optical axis in the resonator mirror 50 is coincident with one optical axis of diffracted light in the diffraction grating 40, so that light reflected at the resonator mirror 50 is returned to the strips 2 through the diffraction grating 40. Accordingly, external resonance occurs between the resonator mirror 50 and the strips 2 (specifically, a rear mirror of each of the strips 2), so that optical intensity is amplified. A part of the amplified light is outputted to outside from the resonator mirror 50. The reflectance of the resonator mirror 50 may be, for example, in a range of 5 to 30%.

In FIG. 1, the advance of externally resonated light is shown by a double-headed arrow of fine dotted lines, and the advance of light outputted from the resonator mirror 50 is shown by a single-headed arrow of coarse dotted lines. Such expression of the direction of light by these arrows is the same in other drawings.

In the present embodiment, optical fibers 20A and 20C located at the upper and lower ends in FIG. 1 extend substantially perpendicularly to the emission surface of the laser diode bar 10, and then are bent so as to extend toward a condensing region of the diffraction grating 40 as shown in FIG. 1, but the optical fibers may be arranged in any appropriate pattern. The optical fiber 20 can be bent in any direction, and causes a small optical loss. Accordingly, with an appropriate incident angle of light from the laser diode bar 10 and an appropriate incident angle of light to the diffraction grating 40, any disposition pattern can be employed between both ends of each of the optical fibers 20A and 20C.

Light Source Device According to Second Embodiment of the Present Disclosure

Figure 2:
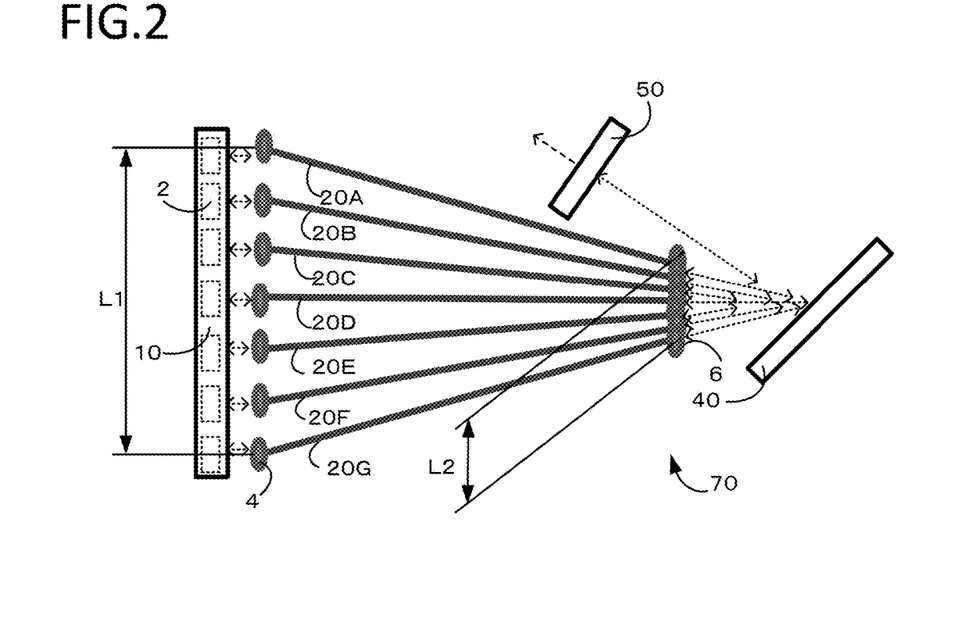
FIG. 2 is a plan view schematically showing a reflection type light source device including optical fibers according to a second embodiment of the present disclosure.

A light source device 70 according to a second embodiment of the present disclosure will be described with reference to FIG. 2. FIG. 2 is a plan view schematically showing a reflection type light source device 70 including optical fibers. In the second embodiment below, a member having the same function as in the first embodiment is given the same reference number as in the first embodiment.

The light source device 70 is different from the light source device 60 according to the first embodiment in that the light source device 70 includes a laser diode bar 10 in which seven strips 2 configured to emit light in a predetermined wavelength region are arranged in one row, and seven optical fibers 20A to 20G are arranged so as to correspond to the seven strips 2. Further, there are two primary differences as below between the light source device 70 and the light source device 60 according to the first embodiment. One of the two differences is that both ends of each of the optical fibers 20A to 20G are separated from the laser diode bar 10 and the diffraction grating 40 in the present embodiment. The other of the two differences is that collimating lenses 4 and 6 are respectively disposed at each of both ends of each of the optical fibers 20A to 20G.

Such collimating lenses 4 and 6 can be connected to each of the optical fibers 20A to 20G as shown in FIG. 2, or can be separated from the optical fiber 20. Thus, the collimating lens 4 can be disposed on an optical path between the laser diode bar 10 and the optical fiber 20 such that the collimating lens 4 is separated from the optical fiber 20, or the collimating lens 6 can be disposed on an optical path between the optical fiber 20 and the diffraction grating 40 such that the collimating lens 6 is separated from the optical fiber 20. Further, a graded index multimode optical fiber (i.e., GI fiber), or a lens array in which a plurality of lenses are integrated can be used in place of the collimating lens 4 and/or the collimating lens 6.

For example, in the case where the strips 2 emits light having a wavelength in a range of 402 nm to 408 nm at incident angles ($\alpha$) with respect to the diffraction grating 40 of the cores of optical fibers 20A to 20G of 44.42 degrees, 44.61 degrees, . . . 45.59 degrees as shown in Table 1, diffracted light can be emitted along a single axis from the diffraction grating while the diffraction angle ($\beta$) of diffracted light of wavelength components of 402, 403, . . . 408 nm is 15.36 degrees.

Optical fibers 20A to 20G almost linearly extend from a laser diode bar 10 side to the diffraction grating 40 side, but alternatively, with an appropriate incident angle of light from the laser diode bar 10 and an appropriate incident angle of light to the diffraction grating 40 in view of the characteristics of optical fibers, optical fibers 20A to 20G may be arranged in any appropriate pattern between the laser diode bat 10 and the diffraction grating 40.

Light Source According to Third Embodiment of the Present Disclosure

Figure 3:
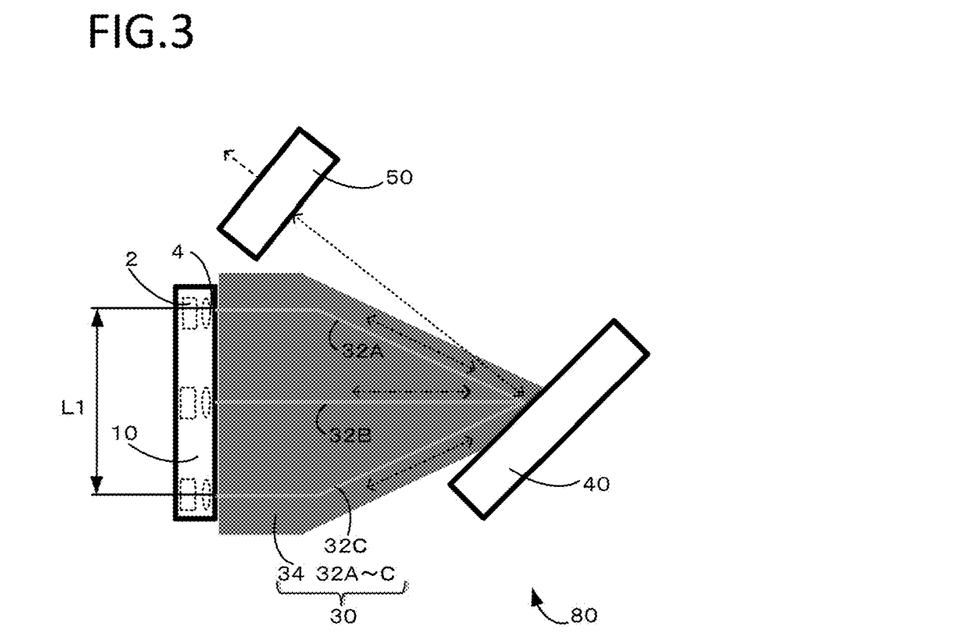
FIG. 3 is a plan view schematically showing a reflection type light source device including an optical waveguide according to a third embodiment of the present disclosure.

A light source device 80 according to a third embodiment of the present disclosure will be described with reference to FIG. 3. FIG. 3 is a plan view schematically showing the reflection type light source device 80 including an optical waveguide.

The light source device 80 includes a laser diode bar 10 having a plurality of strips 2 (in the present embodiment, three strips) configured to emit light in a wavelength region with a predetermined width; a light guiding part having a plurality of cores which corresponds to a plurality of strips 2, respectively, and on which light emitted from the strips 2 is incident; a diffraction grating 40 on which light emitted from the cores is incident; and a resonator mirror 50 on which light emitted from the diffraction grating 40 is incident. In the light source device 80, an optical waveguide 30 having one cladding 34 integrally surrounding a plurality of cores 32A to 32C (in the present embodiments, three cores) is used for the light guiding part having the plurality of cores.

The optical waveguide 30 is an optical component that is integrally molded, in which the plurality of cores, which serve as light transmission paths, are surrounded by a cladding having a refractive index lower than that of the cores. For the optical waveguide 30, for example, an optical component formed into a plate shape or sheet shape may be used, or an optical component formed into any other appropriate shape may be used in accordance with an intended use. As in the optical fiber, light incident on the core from one end of the optical waveguide 30 is totally reflected repeatedly at a boundary between the core and the cladding, and travels from one end to the other end with a very small loss.

In the laser diode bar 10, three strips 2 configured to emit light in a predetermined wavelength range are arranged in a single row, and a collimating lens 4 is disposed at the emission side of each of the strips 2. The optical waveguide 30 is disposed to be connected to the laser diode bar 10 and the diffraction grating 40 without being separated from the laser diode bar 10 and the diffraction grating 40. By the collimating lens 4, collimated light is emitted from the laser diode bar 10, and is incident on the cores 32A to 32C of the optical waveguide 30 which correspond to respective one of the strips 2. Light incident on the cores 32A to 32C is transmitted through cores 32A to 32C to the diffraction grating 40 side.

Cores 32A to 32C are disposed so that collimated light from the collimating lens 4 are incident on the cores 32A to 32C at an end on the laser diode bar 10 side. Cores 32A to 32C are disposed so that, at an end of the optical waveguide 30 on a diffraction grating 40 side, light emitted from cores 32A to 32C is incident on one region of the diffraction grating 40 at different incident angles. Accordingly, among light incident on the diffraction grating 40 from cores 32A to 32C, diffracted light of a predetermined wavelength component is emitted along a single optical axis.

With the optical waveguide 30 formed integrally with the collimate lens 4, assembly can be easily performed by installation of the optical waveguide 30, which can eliminate the need for minute adjustment of the angle of each of cores 32A to 32C at the time of assembling the light source device.

In the case where the strips 2 are configured to emit light having a wavelength in a range of 400 nm to 410 nm at the incident angle on the upper core 32A of 44.03 degrees, at the incident angle on the middle core 32B of 45.00 degrees, and at the incident angle (α) on the lower core 32C of 45.98 degrees, in FIG. 3, as in the light source device 60 according to the first embodiment, the diffraction angle of diffracted light (β) with wavelength components of 400 nm, 405 nm and 410 nm in light emitted from strips 2 is 15.36 degrees. Thus, light can be emitted along a single optical axis from the diffraction grating 40.

The resonator mirror 50 is arranged so that light from the resonator mirror is coincident with one optical axis of diffracted light from the diffraction grating 40. With this arrangement, light reflected at the resonator mirror 50 is returned to the strips 2 through the diffraction grating 40, and the light is externally resonated between the resonator mirror 50 and the strip 2 to be amplified. A part of the amplified light is outputted to outside from the resonator mirror 50.

In FIG. 3, the cores 32A and 32C located at upper and lower end sides of FIG. 3, respectively, extend in a direction substantially perpendicular to an emission surface of the laser diode bar 10, and then are bent so as to extend toward a condensing region of the diffraction grating 40, but may be arranged in any appropriate pattern. With an appropriate incident angle of light from the laser diode bar 10 at each of the cores 32A to 32C and an appropriate incident angle of light at the diffraction grating 40, any core pattern can be employed between both ends of each of the cores 32A to 32C.

Light Source Device According to Fourth Embodiment of the Present Disclosure

Figure 4:
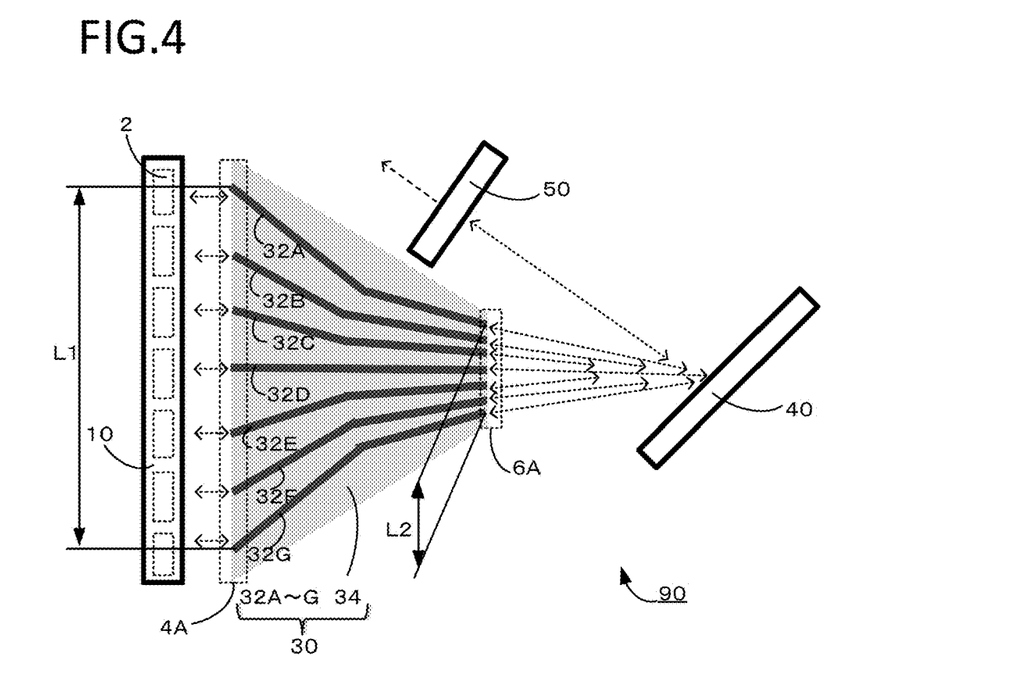
FIG. 4 is a plan view schematically showing a reflection type light source device including an optical waveguide according to a fourth embodiment of the present disclosure.

A light source device 90 according to a fourth embodiment of the present disclosure will be described with reference to FIG. 4. FIG. 4 is a plan view schematically showing the reflection type light source device 90 including an optical waveguide.

The light source device 90 is different from the light source device 80 according to the third embodiment in that the light source device 90 includes a laser diode bar 10 in which seven strips 2 configured to emit light in a predetermined wavelength range are arranged in one row, and seven cores 32A to 32G are arranged so as to correspond to the seven strips 2. Further, there are two primary differences as below between the light source device 90 and the light source device 80 according to the third embodiment. One of the two differences is that, in the present embodiment, both ends of each of cores 32A to 32G are separated from the laser diode bar 10 and the diffraction grating 40. The other of the two differences is that, for an optical member adapted to convert emitted light into collimated light, collimating lenses 4A and 6A are integrally formed with each of the cores 32A to 32G at both ends of each of the cores 32A to 32G of the optical waveguide 30.

The optical member can be not only formed integrally with cores 32A to 32G of the optical waveguide 30, but also disposed to be separated from the core 32. That is, the collimating lens 4A can be disposed on an optical path between the laser diode bar 10 and the optical waveguide 30 such that the collimating lens 4A is separated from the core 32, or the collimating lens 6A can be disposed on an optical path between the optical waveguide 30 and the diffraction grating 40 such that the collimating lens 6A is separated from the core 32.

For example, in the case in which the strip 2 is configured to emit light having a wavelength in a range of 402 nm to 408 nm at incident angles (α) to the diffraction grating 40 of cores 32A to 32G of 44.42 degrees, 44.61 degrees, 44.80 degrees, 45.00 degrees, 45.20 degrees, 45.39 degrees, and 45.59 degrees, respectively, diffracted light of wavelength components of 402, 403, 404, 405, 406, 407, and 408 nm can be emitted along a single axis from the diffraction grating 40 at a diffraction angle (β) of 15.36 degrees.

In FIG. 4, each of the cores 32A to 32G has a shape with a bent portion, but may have any appropriate shape. With an appropriate incident angle of light from the laser diode bar 10 to each of the cores 32A to 32G and an appropriate incident angle of light to the diffraction grating 40, any core pattern can be employed between both ends of each of the cores 32A to 32G.

Light Source Device According to Fifth Embodiment of the Present Disclosure

Figure 5A:
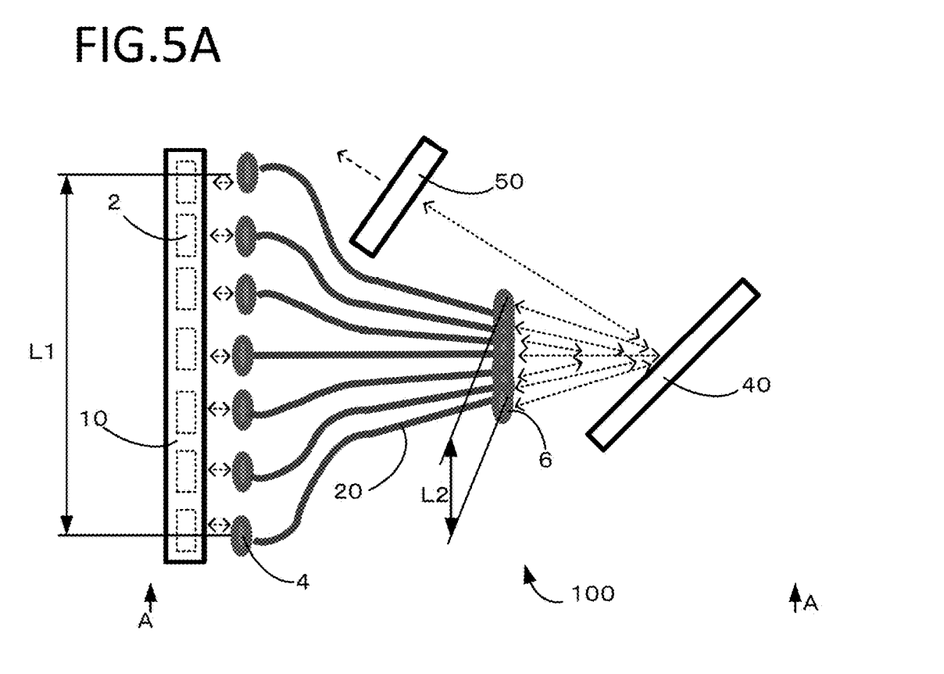
FIG. 5A is a plan view schematically showing the reflection type light source device according to a fifth embodiment of the present disclosure.
Figure 5B:
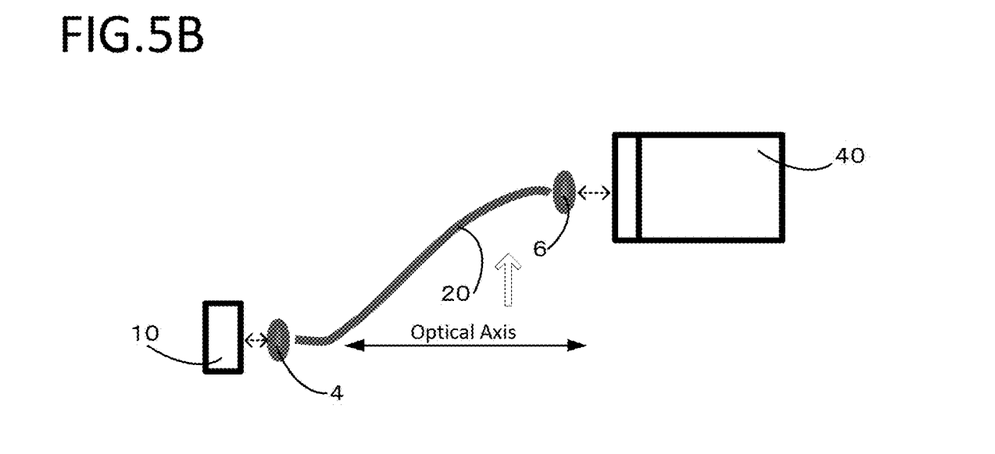
FIG. 5B a side view schematically showing the reflection type light source device according to a fifth embodiment of the present disclosure.

A light source device 100 according to a fifth embodiment of the present disclosure will be described with reference to FIG. 5. FIG. 5A is a plan view schematically showing the reflection type light source device 100, and FIG. 5B a side view schematically showing the reflection type light source device 100.

The light source device 100 has almost the same configuration as the configuration of the light source device 70 including optical fibers 20 as shown in FIG. 2, and the configuration of the light source device 90 including the optical waveguide 30 having cores 32 as shown in FIG. 4. The difference in the configuration of the light source device 100 from the above-described light source devices 70 and 90 is shown in FIG. 5B, which is a side view in a direction indicated by arrow A-A in FIG. 5A.

In the present embodiment, a plurality of strips 2 are disposed in a single row such that that the strips 2 and a portion of each of the optical fibers 20 in the vicinity of an end thereof at a light source side are in the same plane. In other words, the plurality of strips are disposed in one row so that optical axes of light emitted from the plurality of strips are in the same plane between the strip and the core. In this arrangement, the strips 2 are disposed such that a portion of each of the optical fibers 20 in the vicinity of an end at a diffraction grating 40 side and the diffraction grating 40 not in the same plane. In the present embodiment, as indicated by a void arrow illustrated in FIG. 5B, the optical fibers 20 are disposed so as to extend upward in a direction deviating from the optical axis of light emitted from each of the strips 2, and faces the diffraction grating 40. A resonator mirror 50 is disposed in the same plane as a portion of each of the optical fibers 20 in the vicinity of the end of each of the optical fibers 20 on the diffraction grating 40 side, and the diffraction grating 40.

With such an arrangement of the optical fibers 20, a space can be three-dimensionally utilized, which allows for reducing the size of the light source device 100. In the case where a cooling mechanism for cooling the strips 2, such as a heat sink, is disposed at a bottom surface side of the strip 2, the heat sink does not interfere with the diffraction grating 40 even if size of the heat sink is increased to reach a lower portion of the diffraction grating 40. Further, in wavelength beam combining using a reflection type diffraction grating, the resonator mirror 50 is often disposed in the vicinity of the strip 2 and the optical fiber 20. Accordingly, arrangement of the strips 2, optical fibers 20, and the resonator mirror 50 in an upper-lower direction, so that components in the light source device 100 can be arranged more efficiently. This arrangement can be applied not only to the optical fiber 20, but also to the optical waveguide 30. In the case where the arrangement is applied to the optical waveguide 30, a three-dimensional optical path is formed in the optical waveguide 30 beforehand.

Embodiments 1 to 5

Each of the light source devices 60 to 100 according to the first to fifth embodiments described above includes a light guiding part having cores disposed to respectively correspond to respective one of the strips, and to allow light from the cores to be incident on one region of a diffraction grating at different incident angles. With this structure, compared with a case where a condensing lens is used, the strip and the diffraction grating can be connected to each other with a shorter distance therebetween, and efficient arrangement of each of the light source devices 60 to 100 with a reduced useless space is possible. Accordingly, a small light source device that can emit high-output laser light can be provided. If a condensing lens is used instead of the optical waveguide, because a lens has a fixed focal length, the lens and the diffraction grating are required to be arranged with a distance therebetween in accordance with the focal length, which limits a wavelength range of light emitted from the strip when external resonance is performed at the same diffraction angle. On the other hand, the light source devices 60 to 100 according to the first to fifth embodiments described above are not subject to such limitation on the wavelength range.

Further, unlike the case where a condensing lens is used, the manufacturing cost is not greatly increased even if the size of the laser diode bar is increased for increase of the output.

In each of the light source devices 60 to 100 according to the first to fifth embodiments shown in FIGS. 1 to 5, of the plurality of cores, the distance L2 between emission-side end portions (i.e., end portion of each of the cores on the diffraction grating 40 side) of two cores that are farthest from each other at the emission-side end portions thereof is shorter than the distance L1 between the incident-side end portions (i.e., end portion of each of the cores on the laser diode bar 10 side) of two cores that are farthest from each other at the incident-side end portions thereof. In the first and third embodiments shown in FIGS. 1 and 3, the distance between the emission-side ends of cores that are farthest from each other at the emission-side end is very small.

Accordingly, a space can be secured at an emission side (i.e., diffraction grating 40 side) of the core, which allows for reducing the size of the light source device. In particular, in the case where a reflection type diffraction grating is used for the diffraction grating 40, a space for installing the resonator mirror 50 and a space for installing the cores can be more easily secured to further allow reduction in the size of the light source device compared with a case where a transmission type diffraction grating is used.

Other Embodiments

Each of the light source devices 60 to 100 includes a laser diode bar in which the plurality of strips 2 are arranged in one row. Meanwhile, a laser diode bar with strips arranged in a matrix having a plurality of rows in which a plurality of conductor lasers is arranged can be alternatively used. With this structure, diffracted light is emitted from the diffraction grating with a plurality of optical axes each of which corresponds to respective one of the rows. Accordingly, light is output from the resonator mirror with a plurality of optical axes. An optical member that focuses light of a plurality of optical axes may be disposed at an output side of the resonator mirror, which allows for obtaining output light with a high optical density. In this manner, a light source device including a laser diode bar in which a plurality of strips is arranged in a matrix can also be provided.

In each of the light source devices 60 to 100, the laser diode bar includes a plurality of strips configured to emit light with the same center wavelength so that the incident angles of light with respect to the diffraction grating are different from each other and diffracted light of different wavelength components is emitted along a single straight line, but the light source device may alternatively have any appropriate configuration. The laser diode bar may include a plurality of strips configured to emit light with different center wavelengths so that the incident angles of light with respect to the diffraction grating are different from each other and diffracted light of light with different wavelength components is emitted on a single straight line.

Figure 8A:
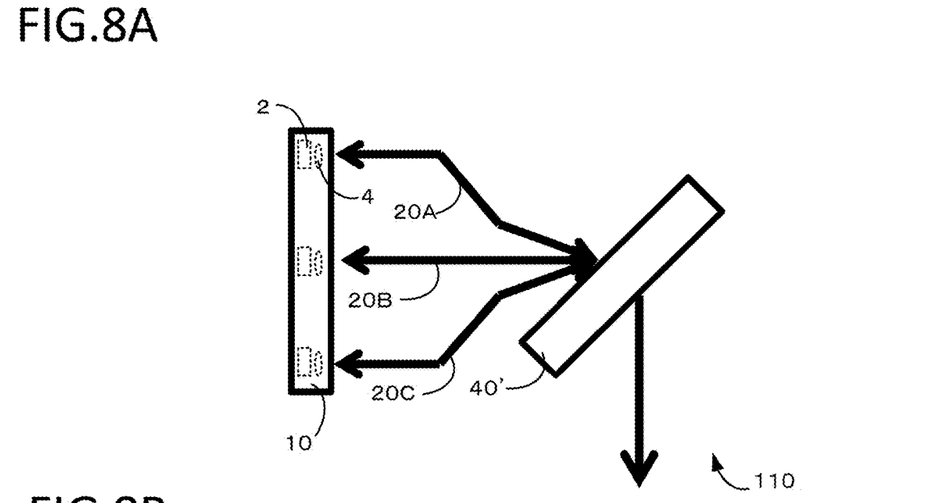
FIGS. 8A to 8B are plan views schematically showing a transmission type light source device according to another embodiment of the present disclosure.
Figure 8B:
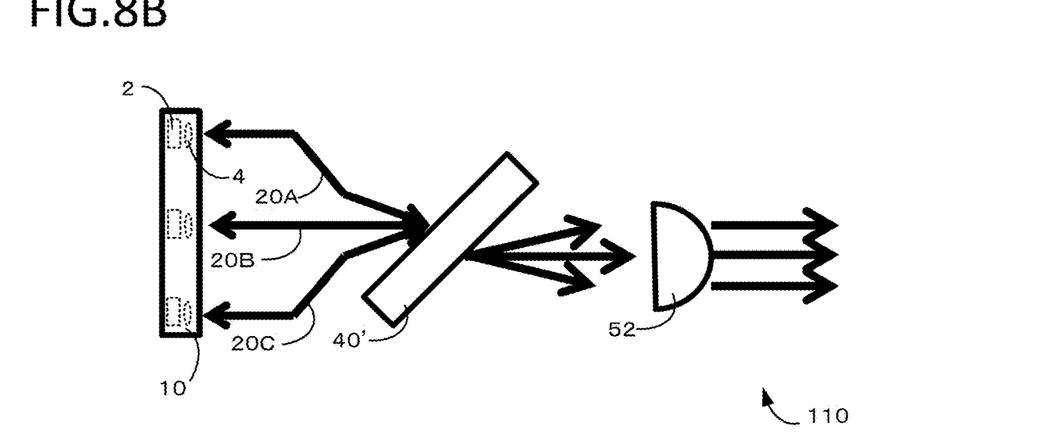

Light Source Device Using Transmitted and Diffracted Light from Diffraction Grating In each of the light source devices 60 to 100, reflected and diffracted light from the diffraction grating is used, but the light source device may alternatively have any appropriate configuration. The light source device may use transmitted and diffracted light from a diffraction grating, as shown in FIGS. 8A and 8B. With a light source device using transmitted and diffracted light, external resonance occurs between a diffraction grating and strips (more specifically, a rear mirror of each of the strips). With a light source device 110 shown in FIG. 8A, transmitted and diffracted first-order light is used as output light, and with a light source device 110 shown in FIG. 8B, transmitted and diffracted zero-order light used as output light. In the case where transmitted and diffracted zero-order light is outputted, the diffracted light is not emitted along the same optical axis, and therefore the diffracted light is required to be condensed using an optical member 52 such as a lens or a prism.

Certain embodiments have been described above, but the invention is not limited thereto, and details of the configuration and elements of the described embodiments may be changed without departing from the claimed scope and idea of the present disclosure.

Example 1

One example of a light source device as shown in FIG. 2 is will be described below. More specifically, for strips 2 made of a semiconductor laser, 51 strips 2 with an output of 3 W, a center wavelength of 405 nm and a gain (i.e., wavelength width) $\Delta\lambda$, of 6 nm are used. The strips are arranged in one row with the interval (i.e., pitch) of 0.5 mm. The strips and optical fibers are disposed so that, on a diffraction grating with 2400 lines/mm, light emitted from the 26th strip from an end of the row, which is located in the middle of the row, is incident at 45 degrees, light emitted from the first strip from the end of the row is incident at 44.43 degrees, and light emitted from the 51st strip from the end of the row is incident at 45.57 degrees, to allow light to have a single optical axis at a diffraction angle of 15.36°. All laser lights are incident to the diffraction grating at different angles. A resonator mirror 50 is disposed in the optical axis direction of light reflected at the diffraction grating. With such a structure, the light source device with an output of 100 W is obtained.

Example 2

Another example of a light source device as shown in FIG. 2 will be described below. The light source device is substantially the same as in Example 1 except that a plurality of strips which has an output of 3 W and configured to emit light having different wavelengths is used. The strips are disposed with the center wavelength sequentially shifted by 0.118 nm from the first to 51st strips from an end of a row of the strips such that the center wavelength of the 26th strip from the end of the row, which is located in the middle of the row, is 405 nm, the center wavelength of the first strip from the end of the row is 402.05 nm, and the center wavelength of the 51st strip from the end of the row is 407.95 nm. With such a structure the light source device with an output of 150 W can be obtained.

DENOTATION OF REFERENCE NUMERALS

2 Strip
4, 4A Collimating lens
6, 6A Collimating lens
10 Laser diode bar
20 Optical fiber
30 Optical waveguide
32 Core
34 Cladding
40, 40' Diffraction grating
50 Resonator mirror
52 Optical member
60 Light source device according to first embodiment
70 Light source device according to second embodiment
80 Light source device according to third embodiment
90 Light source device according to fourth embodiment
100 Light source device according to fifth embodiment
110 Light source device according to other embodiment

What is claimed is:

1. A light source device comprising:
a laser diode bar comprising a plurality of strips configured to emit light in a wavelength region with a predetermined width;
a light guiding part comprising a plurality of cores, each of which corresponds to a respective one of the plurality of strips, and on each of which light emitted from the respective one of the strips is incident;
a diffraction grating on which light emitted from the cores is incident; and
a resonator mirror on which light emitted from the diffraction grating is incident,
wherein the cores are disposed such that emission ends of the cores are not parallel to one another and light emitted from the cores is incident on a region of the diffraction grating at different angles,
wherein the diffraction grating comprises a pattern configured to diffract light incident on the diffraction grating from the cores such that the diffracted light is emitted along a single optical axis, and
wherein the resonator mirror is disposed such that an optical axis of light from the resonator mirror is coincident with the single optical axis of the diffracted light.

2. The light source device according to claim 1, wherein, of the plurality of cores, a distance between emission-side end portions of two cores that are farthest from each other at the emission-side end portion thereof is shorter than a distance between incident-side end portions of two cores that are farthest from each other at the incident-side end portions thereof.

3. The light source device according to claim 2, wherein:
the plurality of strips are disposed in one row so that optical axes of light emitted from the plurality of strips are in the same plane between the strip and the core, and
the core extends in a direction deviating from said same plane at least in the vicinity of an emission side of the core.

4. The light source device according to claim 3, wherein:
the light guiding part comprises a plurality of optical fibers each optical fiber comprising:
a respective one of the cores, and
a cladding surrounding the respective core, and
the light source device further comprises an optical member adapted to convert light emitted from the strips into collimated light at an incident side of each of the optical fibers.

5. The light source device according to claim 3, wherein:
the light guiding part includes a single cladding integrally surrounding the plurality of cores, and
the light source device further comprising an optical member adapted to convert light emitted from each of the strips into collimated light at an incident side of the light guiding part.

6. The light source device according to claim 2, wherein:
the light guiding part comprises a plurality of optical fibers each optical fiber comprising:
a respective one of the cores, and
a cladding surrounding the respective core, and
the light source device further comprises an optical member adapted to convert light emitted from the strips into collimated light at an incident side of each of the optical fibers.

7. The light source device according to claim 2, wherein:
the light guiding part includes a single cladding integrally surrounding the plurality of cores, and
the light source device further comprising an optical member adapted to convert light emitted from each of the strips into collimated light at an incident side of the light guiding part.

8. The light source device according to claim 1, wherein:
the plurality of strips are disposed in one row so that optical axes of light emitted from the plurality of strips are in the same plane between the strip and the core, and
the core extends in a direction deviating from said same plane at least in the vicinity of an emission side of the core.

9. The light source device according to claim 8, wherein:
the light guiding part comprises a plurality of optical fibers each optical fiber comprising:
a respective one of the cores, and
a cladding surrounding the respective core, and
the light source device further comprises an optical member adapted to convert light emitted from the strips into collimated light at an incident side of each of the optical fibers.

10. The light source device according to claim 8, wherein:
the light guiding part includes a single cladding integrally surrounding the plurality of cores, and
the light source device further comprising an optical member adapted to convert light emitted from each of the strips into collimated light at an incident side of the light guiding part.

11. The light source device according to claim 1, wherein:
the light guiding part comprises a plurality of optical fibers each optical fiber comprising:
a respective one of the cores, and
a cladding surrounding the respective core, and the light source device further comprises an optical member adapted to convert light emitted from the strips into collimated light at an incident side of each of the optical fibers.

12. The light source device according to claim 1, wherein:

the light guiding part includes a single cladding integrally surrounding the plurality of cores, and the light source device further comprising an optical member adapted to convert light emitted from each of the strips into collimated light at an incident side of the light guiding part.

* * * * *